(12) United States Patent
Zeng et al.

(10) Patent No.: US 11,309,297 B2
(45) Date of Patent: Apr. 19, 2022

(54) LIGHT-EMITTING DIODE CHIP, DEVICE, AND LAMP

(71) Applicant: XIAMEN SANAN OPTOELECTRONICS TECHNOLOGY CO., LTD., Xiamen (CN)

(72) Inventors: Xiaoqiang Zeng, Xiamen (CN); Shaohua Huang, Xiamen (CN); Jianfeng Yang, Xiamen (CN); Canyuan Zhang, Xiamen (CN)

(73) Assignee: XIAMEN SANAN OPTOELECTRONICS TECHNOLOGY CO., LTD., Fujian (CN)

( * ) Notice: Subject to any disclaimer, the term of this patent is extended or adjusted under 35 U.S.C. 154(b) by 0 days.

(21) Appl. No.: 16/995,551

(22) Filed: Aug. 17, 2020

(65) Prior Publication Data

US 2020/0381412 A1 Dec. 3, 2020

Related U.S. Application Data

(63) Continuation-in-part of application No. PCT/CN2019/073255, filed on Jan. 25, 2019.

(51) Int. Cl.
| | |
|---|---|
| *H01L 33/00* | (2010.01) |
| *H01L 25/16* | (2006.01) |
| *H01L 23/00* | (2006.01) |
| *H01L 33/38* | (2010.01) |
| *H01L 33/62* | (2010.01) |

(52) U.S. Cl.
CPC ............ *H01L 25/167* (2013.01); *H01L 24/08* (2013.01); *H01L 33/382* (2013.01); *H01L 33/62* (2013.01); *H01L 2224/08265* (2013.01); *H01L 2924/12041* (2013.01); *H01L 2924/19041* (2013.01)

(58) Field of Classification Search
CPC ..... H01L 25/167; H01L 24/08; H01L 33/382; H01L 33/62; H01L 2224/08265; H01L 2924/12041; H01L 2924/19041; H01L 33/42; H01L 33/48; H01L 28/40; H01L 23/62
See application file for complete search history.

(56) References Cited

U.S. PATENT DOCUMENTS

| | | | |
|---|---|---|---|
| 5,670,207 A * | 9/1997 | Nire | H05B 33/12 427/126.2 |
| 2007/0004066 A1* | 1/2007 | Wuu | H01L 33/0093 438/29 |

(Continued)

*Primary Examiner* — Ismail A Muse
(74) *Attorney, Agent, or Firm* — Thomas | Horstemeyer, LLP.

(57) ABSTRACT

A light-emitting diode (LED) chip includes a semiconductor epitaxial structure, an insulating substrate, a first metal layer, and a second metal layer. The semiconductor epitaxial structure includes a first semiconductor epitaxial layer, a second semiconductor epitaxial layer, and a light-emitting layer interposed between the first semiconductor epitaxial layer and the second semiconductor epitaxial layer. The insulating substrate has two opposite surfaces, and the first and second metal layers are respectively disposed on the two surfaces of the insulating substrate. An LED device and an LED lamp including the LED chip are also disclosed.

15 Claims, 4 Drawing Sheets

(56) References Cited

U.S. PATENT DOCUMENTS

| | | | |
|---|---|---|---|
| 2011/0175138 A1* | 7/2011 | Bhat | H01L 27/15 257/100 |
| 2012/0281388 A1* | 11/2012 | Cai | F21V 29/85 362/84 |
| 2016/0262230 A1* | 9/2016 | Park | H05B 45/42 |
| 2016/0329378 A1* | 11/2016 | Li | H01L 51/0005 |
| 2017/0077346 A1* | 3/2017 | Han | H01L 33/145 |
| 2018/0088215 A1* | 3/2018 | Halbritter | G01S 17/10 |
| 2018/0102350 A1* | 4/2018 | Kim | H01L 24/11 |
| 2021/0050475 A1* | 2/2021 | Tsai | H01L 33/0062 |

* cited by examiner

LIGHT-EMITTING DIODE CHIP, DEVICE, AND LAMP

CROSS-REFERENCE TO RELATED APPLICATION

This application is a bypass continuation-in-part application of International Application No. PCT/CN2019/073255 filed on Jan. 25, 2019.

FIELD

The disclosure relates to a semiconductor device, and more particularly to a light-emitting diode chip and device.

BACKGROUND

Light-emitting diode (LED) devices with high power and high brightness have attracted much attention in the current market. It is noted that when a high power LED device having an horizontal chip structure is disposed on a sapphire substrate to be operated under high current, the horizontal chip structure is prone to overheat and burn out due to poor heat dissipation of the sapphire substrate and current crowding effect. Therefore, the horizontal chip structure is not adapted for use in high power LED devices. In contrast, regarding LED devices having a vertical chip structure, the substrate thereof might be substituted with one made of a material with improved heat dissipation and thermal conductivity (e.g., Si, CuW, etc.), such that the current crowding effect would not occur in the vertical chip structure. Therefore, LED devices having the vertical chip structure can be operated at high current density and adapted for use in high power LEDs. However, there is still a need to develop high power LED devices having an enhanced durability against transient high-voltage pulse and electrostatic discharge (ESD).

SUMMARY

An object of the disclosure is to provide a light-emitting diode (LED) chip that can alleviate at least one of the drawbacks of the prior art.

According to the disclosure, the LED chip includes a semiconductor epitaxial structure, an insulating substrate, a first metal layer, and a second metal layer.

The semiconductor epitaxial structure includes a first semiconductor epitaxial layer, a second semiconductor epitaxial layer, and a light-emitting layer interposed between the first semiconductor epitaxial layer and the second semiconductor epitaxial layer.

The insulating substrate has two opposite surfaces. The first metal layer is disposed on one of the two surfaces of the insulating substrate, and the second metal layer is disposed on the other one of the two surfaces of the insulating substrate.

Another object of the disclosure is to provide an LED device and an LED lamp that can alleviate at least one of the drawbacks of the prior art.

According to the disclosure, the LED device includes the LED chip as mentioned above. The LED lamp includes the LED device as mentioned above.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
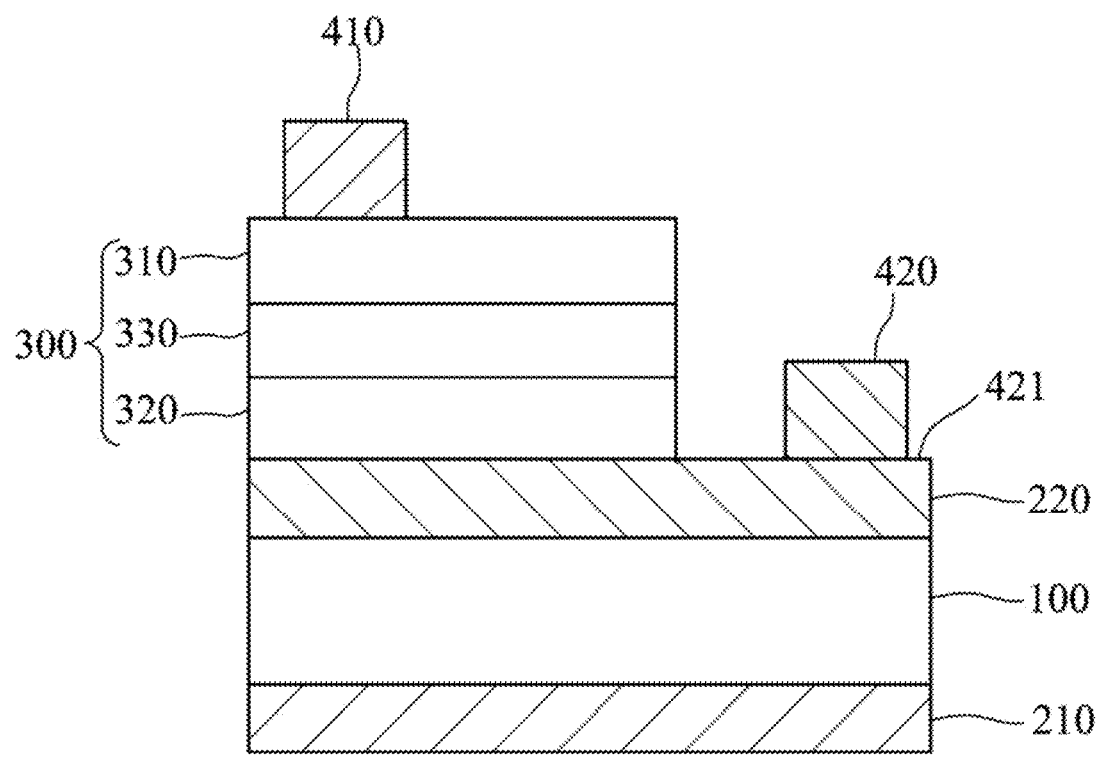
FIG. 1 is a schematic sectional view illustrating a first embodiment of a light-emitting diode chip according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light-emitting diode (LED) chip according to the present disclosure includes an insulating substrate 100, a first metal layer 210, a second metal layer 220, and a semiconductor epitaxial structure 300.

The insulating substrate 100 has two opposite surfaces (i.e., upper and bottom surfaces). The insulating substrate 100 may be made of an insulating material having a relatively large dielectric constant (ε), e.g., ranging from 3.3 to 30. When the insulating material having too small dielectric constant (such as lower than 3.3), the insulating substrate 100 made therefrom is prone to fracture. Examples of the insulating material for making the insulating substrate 100 may include, but are not limited to, aluminium oxide (such as amorphous aluminium oxide having a dielectric constant of about 9), aluminium nitride, silica, sapphire (having a dielectric constant of about 13), and combinations thereof. In this embodiment, the insulating substrate 100 is made of sapphire due to a relatively higher ε and a relatively lower production cost.

The first and second metal layers 210, 220 are respectively disposed on the two opposite surfaces of the insulating substrate 100 by, e.g., an evaporation process, a sputtering process, a back side metallization process, or an adhesion process. Since internal stress may be present between the insulating substrate 100 and the first and second metal layers 210, 220, the insulating substrate 100 needs to have a sufficient thickness to prevent from fracture. In certain embodiments, the insulating substrate 100 has a thickness (d) ranging from 80 μm to 100 μm.

In this embodiment, the first metal layer 21 having an electrical conductivity is disposed on the bottom surface of the insulating substrate 100, and the second metal layer 220 serving as a bonding layer or a metal reflection layer is disposed on the upper surface of the insulating substrate 100. The first metal layer 210, the second metal layer 220, and the insulating substrate 100 cooperatively form a capacitor structure (see FIG. 2).

The semiconductor epitaxial structure 300 is disposed on the capacitor structure. In this embodiment, the semiconductor epitaxial structure 300 is bonded to the second metal layer 220 opposite to the insulating substrate 100, and a portion of the second metal layer 220 is exposed from the semiconductor epitaxial structure 300 and serves as a second electrode window region 421.

The semiconductor epitaxial structure 300 includes a first semiconductor epitaxial layer 310, a second semiconductor epitaxial layer 320 disposed on the second metal layer 220, and a light-emitting layer 330 interposed between the first semiconductor epitaxial layer 310 and the second semiconductor epitaxial layer 320. In this embodiment, the first semiconductor epitaxial layer 310 is an n-type semiconductor layer, the light-emitting layer 330 has a multiple quantum well structure, and the second semiconductor epitaxial layer 320 is a p-type semiconductor layer. Alternatively, in certain embodiments, the first semiconductor epitaxial layer 310 may be a p-type semiconductor layer, and the second semiconductor epitaxial layer 320 may be an n-type semiconductor layer. In certain embodiments, a metal layer, which may be made of a material selected from a group of chromium, aluminum, titanium, platinum, and gold, is further formed on the second semiconductor epitaxial layer 320 to bond the second semiconductor epitaxial layer 320 to the second metal layer 220.

The LED chip may further include a first electrically connecting element 410 and a second electrically connecting element 420. The first electrically connecting element 410 is disposed on and electrically connected to the first semiconductor epitaxial layer 310. The second electrically connecting element 420 is disposed on the second electrode window region 421 of the second metal layer 220 and is electrically connected to said second semiconductor epitaxial layer 320. Each of the first electrically connecting element 410 and the second electrically connecting element 420 is made of a material selected from the group consisting of metal, alloy, indium tin oxide (ITO), gallium-doped zinc oxide (GZO), aluminum-doped zinc oxide (AZO), and combinations thereof. For example, the first or second electrically connecting element 410, 420 may include ITO serving as ohmic contact, and the metal or alloy covered on the ITO.

Figure 2:
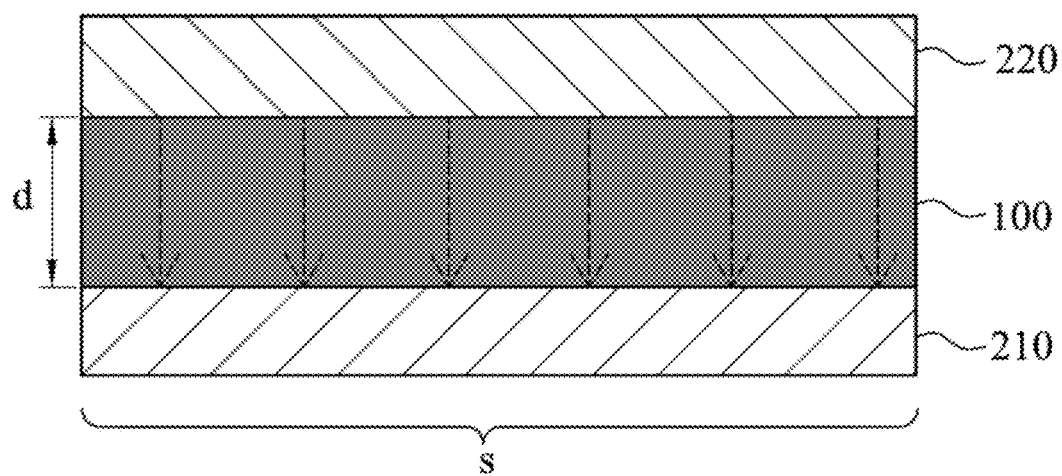
FIG. 2 is a schematic sectional view illustrating a capacitor structure formed in the first embodiment of the disclosure.

Referring to FIG. 2, the capacitor structure of the LED chip has a capacitance determined from an equation of:

$$C=\varepsilon^{*}\varepsilon_{0}^{*}S/d,$$

wherein S represents an area of a connecting surface of a respective one of the first and the second metal layers 210, 220 for connecting with the insulating substrate 100, $\varepsilon$ represents a dielectric constant of the insulating substrate 100, d represents a thickness of the insulating substrate 100, and $\varepsilon_0$ represents a dielectric constant of vacuum (i.e., equal to $8.854 \times 10^{-12}$ F/m).

In certain embodiments, the capacitor structure has a capacitance ranging from 0.5 pF to 100 pF, so as to protect the LED chip from, e.g., the electrostatic discharge (ESD). It should be noted that if the capacitor structure has a capacitance that is too large (e.g., greater than 100 pF), too much electric charge may be stored therein, resulting in absence of current flow in the LED chip (i.e., forming an open circuit).

According to the above equation, it is noted that for achieving the desired range of the capacitance, when the insulating substrate 100 has a relatively small dielectric constant, the insulating substrate 100 needs to be thinner and/or the area (s) of the connecting surface of a respective one of the first and second metal layers 210, 220 for connecting with the insulating substrate 100 needs to be larger. In certain embodiments, the dielectric constant of the insulating substrate 100 is not less than 3.3, and the area (S) of the connecting surface of a respective one of the first and second metal layers 210, 220 is larger than 0.5 mm$^2$ (for instance, 0.5 mm<S≤20 mm$^2$).

In this embodiment, the LED chip has a size of 1000 μm (length)×800 μm (width), and the area (s) of the connecting surface of a respective one of the first and second metal layers 210, 220 for connecting with the insulating substrate 100 is equal to the area of the LED chip (i.e., 0.8 mm$^2$). The insulating substrate 100 made of sapphire has a dielectric constant of about 13, and has a thickness (d) set to be 100 μm. Therefore, the capacitance of the LED chip is 0.9 pF as determined from the above equation.

Figure 3:
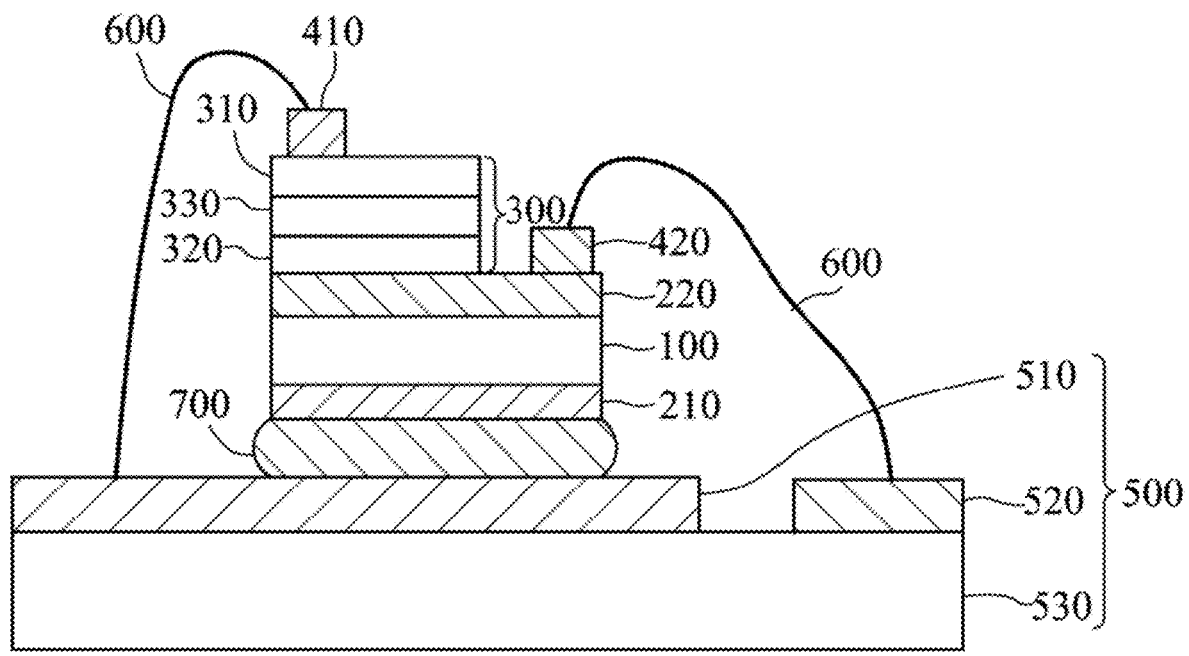
FIG. 3 is a schematic sectional view illustrating a first embodiment of a light-emitting diode device according to the disclosure.

Referring to FIG. 3, a first embodiment of an LED device according to this disclosure includes the first embodiment of the LED chip as described above, and a packaging substrate unit 500 for supporting the LED chip. The first metal layer 210 is interposed between the insulating substrate 100 and the packaging substrate unit 500. The first metal layer 210 may be a metal, paste (such as a solder paste) for electrical connection.

The packaging substrate unit 500 has a packaging substrate 530, and a first conductive layer 510 and a second conductive layer 520 that are disposed on the packaging substrate 530 and that are spaced apart from each other. In this embodiment, the first metal layer 210 is bonded to the first conductive layer 510 through, e.g., a die-bonding paste 700, such that the LED chip is mounted on the packaging substrate unit 500.

The LED device further includes two solder wires 600, one of the solder wires 600 interconnecting the first electrically connecting element 410 and the first conductive layer 510, the other one of the solder wires 600 interconnecting the second electrically connecting element 420 and the second conductive layer 520. That is, the first metal layer 210, which has N polarity, is electrically connected to the first conductive layer 510. The second metal layer 220, which has P polarity opposite to that of the first metal layer 210, is electrically connected to the second conductive layer 520 through the second electrically connecting element 420.

Figure 4:
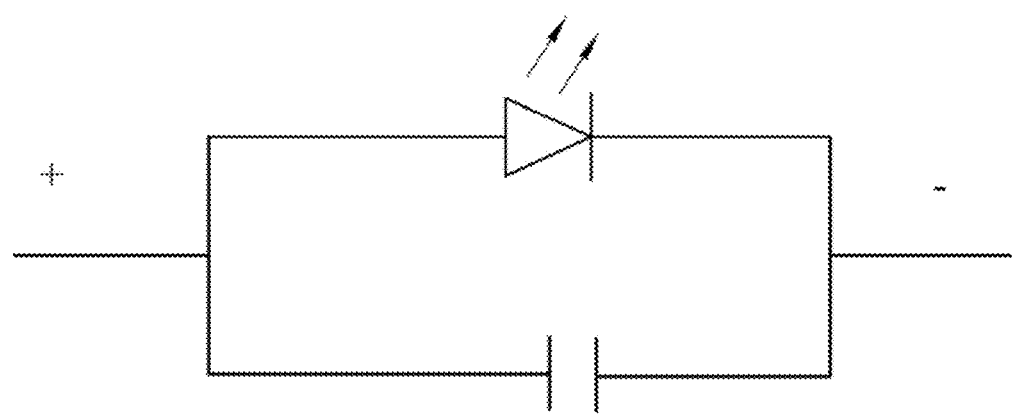
FIG. 4 is an equivalent circuit diagram of FIG. 3.

Referring to FIG. 4, in the first embodiment of the LED device, the capacitor structure cooperatively formed by the first metal layer 210, the second metal layer 220 and the insulating substrate 100 is electrically connected in parallel to the semiconductor epitaxial structure 300 through the solder wires 600, the die-bonding paste 700, the first conductive layer 510, and the second conductive layer 520. In use, the capacitor structure is firstly charged, and then the semiconductor epitaxial structure 300 is activated thereby.

Figure 5:
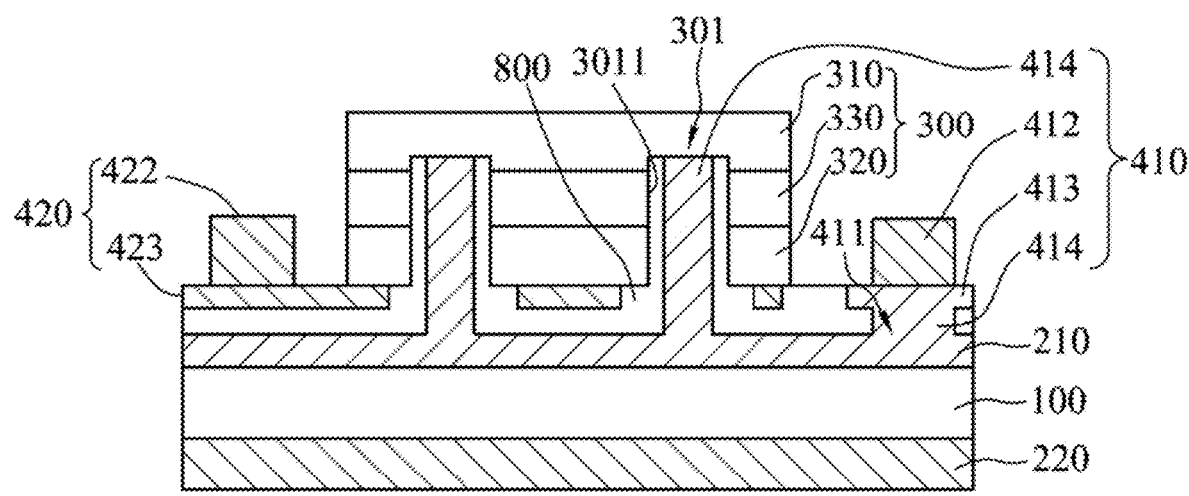
FIG. 5 is a schematic sectional view illustrating a second embodiment of a light-emitting diode chip according to the disclosure.

Referring to FIG. 5, a second embodiment of the LED chip according to the present disclosure is provided, and is generally similar to the first embodiment except for the following differences.

In the second embodiment, the first metal layer 210 serving as a bonding layer or a metal reflection layer is disposed on the upper surface of the insulating substrate 100, and the second metal layer 220 having an electrical conductivity is disposed on the bottom surface of the insulating substrate 100.

The semiconductor epitaxial structure 300 is bonded to the first metal layer 210 opposite to the insulating substrate 100, and a portion of the first metal layer 210 is exposed from the semiconductor epitaxial structure 300 and serves as a first electrode window region 411 of the first electrically connecting element 410 disposed thereon.

In addition, the semiconductor epitaxial structure 300 further includes at least one hole 301 that is defined by a hole-defining wall 3011, and that extends through the second semiconductor epitaxial layer 320 and the light-emitting layer 330 and terminates at and exposes the first semiconductor epitaxial layer 310.

After the formation of the hole 301, a patterned metal layer is formed on a non-hole region of the second semiconductor epitaxial layer 320 (i.e., not covering the hole 301 and having a spacing to the hole 301 in case of short circuit), and then a part of the semiconductor epitaxial structure 300 is removed by, e.g., an etching process, to expose two regions of the patterned metal layer. One of the two exposed regions of the patterned metal layer serves as a first extension part 413 of the first electrically connecting element 410 on which a first electrode 412 is disposed. The other one of the two exposed regions of the patterned metal layer serves as a second extension part 423 of the second electrically connecting element 420 on which a second electrode 422 is disposed. That is, the first electrically connecting element 410 includes the first electrode 412 and the first extension part 413. The second electrically connecting element 420 includes a second electrode 422 and a second extension part 423. The LED chip may further include an insulating layer 800 for electrically isolating the second electrically connecting element 420 from the first metal layer 210 and the first electrically connecting element 410. The first electrically connecting element 410 further includes an extending connection part 414 that extends into the hole 301 and that contacts with the first semiconductor epitaxial layer 310. The insulating layer 800 covers the hole-defining wall 3011, and is disposed between the extending connection part 414 and the semiconductor epitaxial structure 300. The processes for making the insulating layer 800 and the extending connection part 414 are described as follows.

Specifically, a dielectric material is applied on and covers the patterned metal layer and fills the hole 301, and then a portion of the dielectric material located at a central region of the hole 301 and on the first extension part 413 is removed to expose the first semiconductor epitaxial layer 310 and the first extension part 413, such that the insulating layer 800 covering the hole-defining wall 3011 and the patterned metal layer is formed.

Then, the extending connection part 414 is formed by depositing a metallic material on the exposed portion of the first semiconductor epitaxial layer 310 within the hole 301 and on the exposed portion of the first extension part 413. That is, the extending connection part 414 extends into the central region of the hole 301 and contacts with the first semiconductor epitaxial layer 310. Therefore, the first semiconductor epitaxial layer 310 and the first extension part 413 are electrically connected to the first metal layer 210 through the extending connection part 414.

In the second embodiment, the first metal layer 210 includes an ohmic contact material, a reflective material, and a bonding material. The insulting substrate 100 may be bonded to the semiconductor epitaxial structure 300 through the bonding material of the first metal layer 210.

Figure 6:
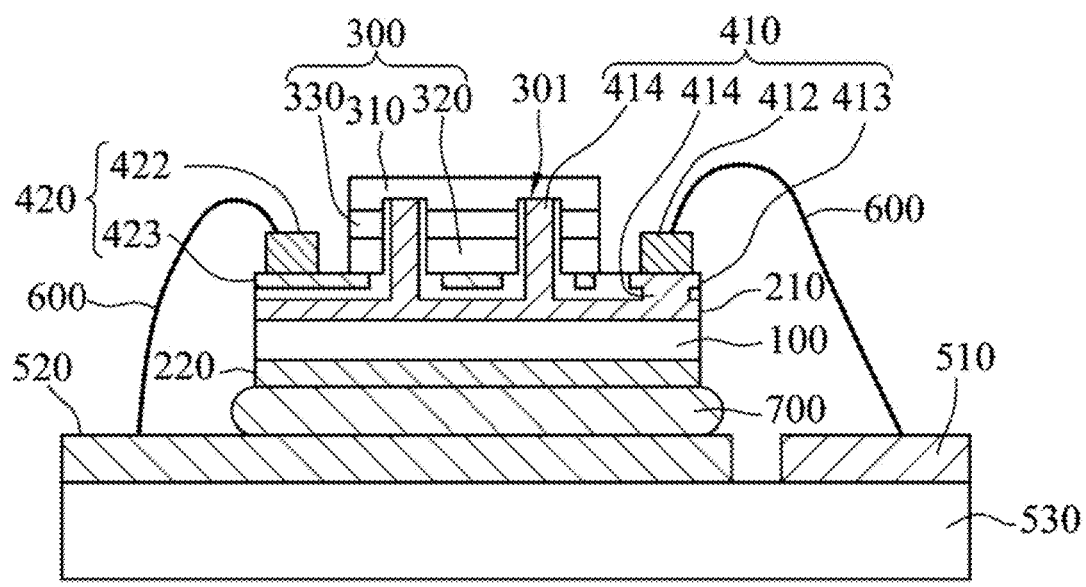
FIG. 6 is a schematic sectional view illustrating a second embodiment of a light-emitting diode device according to the disclosure.

Referring to FIG. 6, a second embodiment of the LED device includes the second embodiment of the LED chip, and is generally similar to the first embodiment of the LED device except for the following differences.

In the second embodiment, the second metal layer 220 is bonded to the second conductive layer 520 through a die-bonding paste 700. That is, the second metal layer 220 is interposed between the insulating substrate 100 and the packaging substrate 500.

The first metal layer 210, which has N polarity (N-type metal), is electrically connected to the first conductive layer 510 through the first electrically connecting element 410. The second metal layer 220, which is a back contact and has P polarity (P-type metal), is electrically connected to the second conductive layer 520. The LED chip may have a lateral structure (i.e., face-up chip) or a vertical structure.

The first and second electrically connecting elements 410, 420 are respectively electrically connected to the first and second conductive layers 510, 520 through the solder wires 600 (i.e., wire bonding). Alternatively, the first electrically connecting element 410 (or the second electrically connecting element 420) may be electrically connected to the first conductive layer 510 (or the second conductive layer 520) through other manners, such as insertion or attachment, so as to form a parallel circuit between the semiconductor epitaxial structure 300 and the capacitor structure.

In use, by virtue of the insulating layer 800 electrically isolating the second electrical connecting element 420 from the first metal layer 210 and the first electrically connecting element 410, the electric current, which flows through the LED chip from the second semiconductor epitaxial layer 320 towards the first semiconductor epitaxial layer 310 along the extending connection part 414 within the hole 301, is evenly conducted in the semiconductor epitaxial structure 300. Therefore, the LED device of this disclosure exhibits an improved current spreading effect, and thus is suitable for high current density applications.

The present disclosure also provides an LED lamp including the abovementioned LED device.

Figure 7:
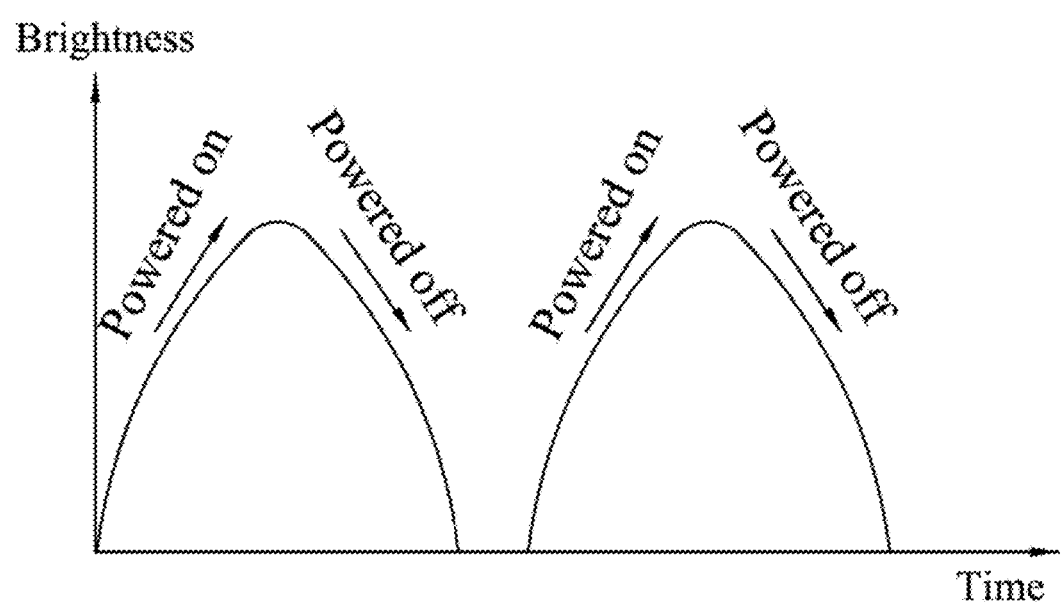
FIG. 7 is a plot showing correlation between the brightness and the time of a breathing LED lamp according to the disclosure.

In certain embodiments, the LED lamp is a breathing lamp, which is adapted for use in decoration and as indicator of working status. By virtue of the capacitor structure having a built-in capacitance and an adjustment of direct current pulse-width modulation (PWM), the light brightness of the breathing lamp changes gradually from light to dark, i.e., in a way similar to human breathing. Specifically, referring to FIG. 7, when the capacitor structure of the LED device is powered on (i.e., charged state), the light brightness of the LED lamp changes gradually from dark to light. When the capacitor structure is powered off (i.e., discharged state), the light brightness of the LED lamp changes gradually from light to dark. The capacitance of the capacitor structure in the LED lamp may be adjusted according to the practical requirements by, e.g., changing the area of the connecting surface of a respective one of the first and the second metal layers for connecting with the insulating substrate, and/or the dielectric constant of the insulating substrate. In addition, the capacitor structure in the LED lamp of this disclosure is capable of improving the endurance of the LED device against transient high-voltage pulse and ESD.

In other embodiments, the LED lamp is a warning lamp, which is adapted for use in high current density applications. By virtue of the capacitor structure, the light brightness of the warning lamp changes gradually from light to dark. The second embodiment of the LED device is particularly adapted for use in the warning lamp.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED) device, comprising:
    a semiconductor epitaxial structure including a first semiconductor epitaxial layer, a second semiconductor epitaxial layer, and a light-emitting layer interposed between said first semiconductor epitaxial layer and said second semiconductor epitaxial layer;
    a packaging substrate unit for support;
    an insulating substrate having two opposite surfaces;
    a first metal layer disposed on one of said two surfaces of said insulating substrate; and
    a second metal layer disposed on the other one of said two surfaces of said insulating substrate,
    wherein said first metal layer, said second metal layer and said insulating substrate cooperatively form a capacitor structure that is electrically connected in parallel to said semiconductor epitaxial structure;
    wherein said packaging substrate unit includes a packaging substrate, and a first conductive layer and a second conductive layer that are disposed on said packaging substrate and that are spaced apart from each other, said first metal layer being electrically connected to said first conductive layer, said second metal layer being electrically connected to said second conductive layer.

2. The LED device of claim 1, wherein one of said first and second metal layers is interposed between said insulating substrate and said packaging substrate unit.

3. The LED device of claim 1, further comprising a first electrically connecting element that is electrically connected to said first semiconductor epitaxial layer, and a second electrically connecting element that is electrically connected to said second semiconductor epitaxial layer.

4. The LED device of claim 3, further comprising two solder wires, one of said solder wires interconnecting said first electrically connecting element and said first conductive layer, the other one of said solder wires interconnecting said second electrically connecting element and said second conductive layer.

5. An LED lamp, comprising an LED device as claimed in claim 1.

6. The LED device of claim 1, wherein said capacitor structure has a capacitance ranging from 0.5 pF to 100 pF.

7. The LED device of claim 1, wherein the dielectric constant of said insulating substrate ranges from 3.3 to 30.

8. The LED device of claim 1, wherein each of said first and said second metal layers has a connecting surface for connecting with said insulating substrate, said connecting surface having an area that is greater than 0.5 mm$^2$ and is smaller than 20 mm$^2$.

9. The LED device of claim 1, wherein said insulating substrate has a thickness ranging from 80 μm to 150 μm.

10. The LED device of claim 1, wherein said insulating substrate is made of a material selected from the group consisting of sapphire, aluminium oxide, aluminium nitride, silica, and combinations thereof.

11. The LED device of claim 1, wherein each of said first metal layer and said second metal layer includes one of an ohmic contact layer, a bonding layer, an adhesive layer, and a metal reflection layer.

12. The LED device of claim 1, further comprising a first electrically connecting element that is electrically connected to said first semiconductor epitaxial layer, and a second electrically connecting element that is electrically connected to said second semiconductor epitaxial layer.

13. The LED device of claim 12, wherein said semiconductor epitaxial structure further includes at least one hole that is defined by a hole-defining wall, and that extends through said second semiconductor epitaxial layer and said light-emitting layer and terminates at and exposes said first semiconductor epitaxial layer, said first electrically connecting element including an extending connection part that extends into said hole and contacts with said first semiconductor epitaxial layer.

14. The LED device of claim 13, further comprising an insulating layer for electrically isolating said second electrically connecting element from said first metal layer and said first electrically connecting element, said insulating layer covering said hole-defining wall and being disposed between said extending connection part and said semiconductor epitaxial structure, said extending connection part being made of a metal material.

15. The LED device of claim 12, wherein each of said first electrically connecting element and said second electrically connecting element is made of a material selected from the group consisting of metal, alloy, indium tin oxide (ITO), gallium-doped zinc oxide (GZO), aluminum-doped zinc oxide (AZO), and combinations thereof.

* * * * *